(12) United States Patent
Kapusta et al.

(10) Patent No.: US 7,752,751 B2
(45) Date of Patent: Jul. 13, 2010

(54) SYSTEM AND METHOD OF FORMING A LOW PROFILE CONFORMAL SHIELD

(75) Inventors: Christopher James Kapusta, Delanson, NY (US); Donald Cunningham, Dallas, TX (US); Richard Joseph Saia, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/058,912

(22) Filed: Mar. 31, 2008

(65) Prior Publication Data
US 2009/0242263 A1   Oct. 1, 2009

(51) Int. Cl.
*H01K 3/10* (2006.01)

(52) U.S. Cl. .......................... 29/852; 29/846; 427/96.3; 427/96.4

(58) Field of Classification Search ................. 174/377, 174/384, 387; 361/816, 818; 427/96.3, 96.4; 29/846, 852, 841
See application file for complete search history.

(56) References Cited

U.S. PATENT DOCUMENTS

| | | | | |
|---|---|---|---|---|
| 4,399,487 A | * | 8/1983 | Neumann | 361/727 |
| 5,166,864 A | * | 11/1992 | Chitwood et al. | 361/720 |
| 5,557,064 A | | 9/1996 | Isern-Flecha et al. | |
| 5,639,989 A | * | 6/1997 | Higgins, III | 174/386 |
| 2006/0152913 A1 | * | 7/2006 | Richey et al. | 361/818 |

* cited by examiner

*Primary Examiner*—Hung V Ngo
(74) *Attorney, Agent, or Firm*—Ziolkowski Patent Solutions Group, SC; Jean K. Testa

(57) ABSTRACT

A system and method for providing shielding to an electrical system is disclosed. A conformal shield is formed by applying a conformal insulating coating to an electrical system. A plurality of openings are formed in the insulating coating at desired locations and a first metallic layer is deposited over the insulating coating and in each of the plurality of openings, the first metallic layer being electrically connected with the circuit board at the desired locations. A second metallic layer is then deposited onto the first metallic layer to increase a thickness of the metallic layers.

18 Claims, 4 Drawing Sheets

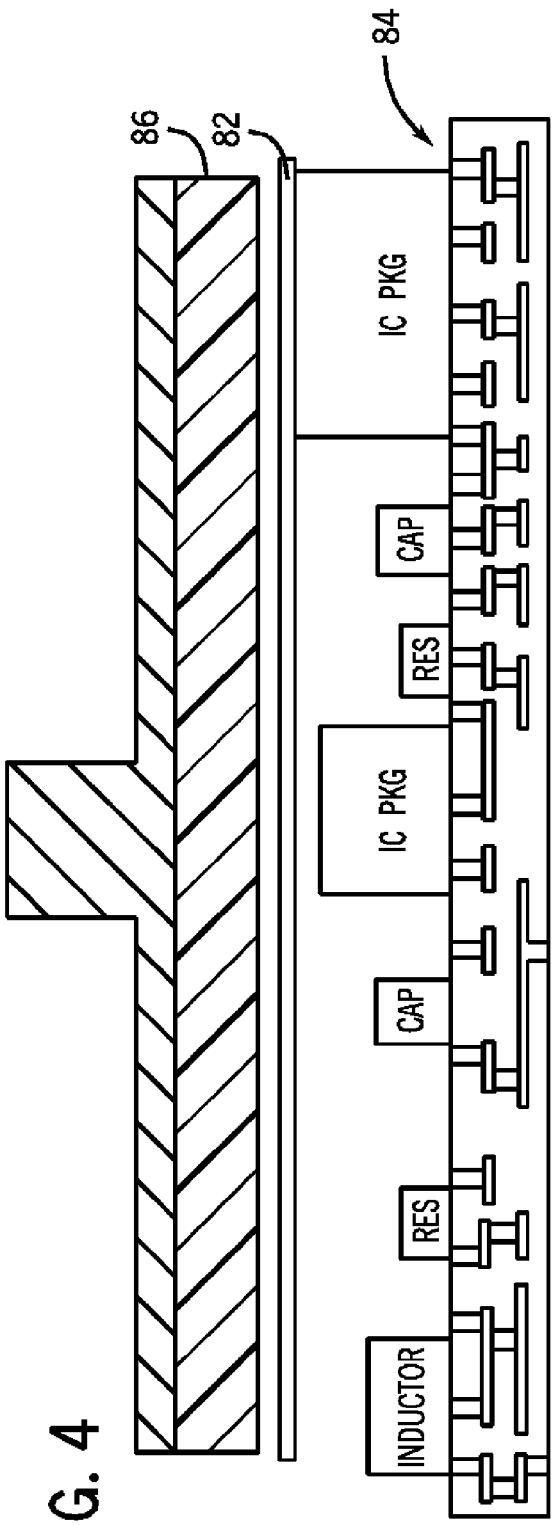
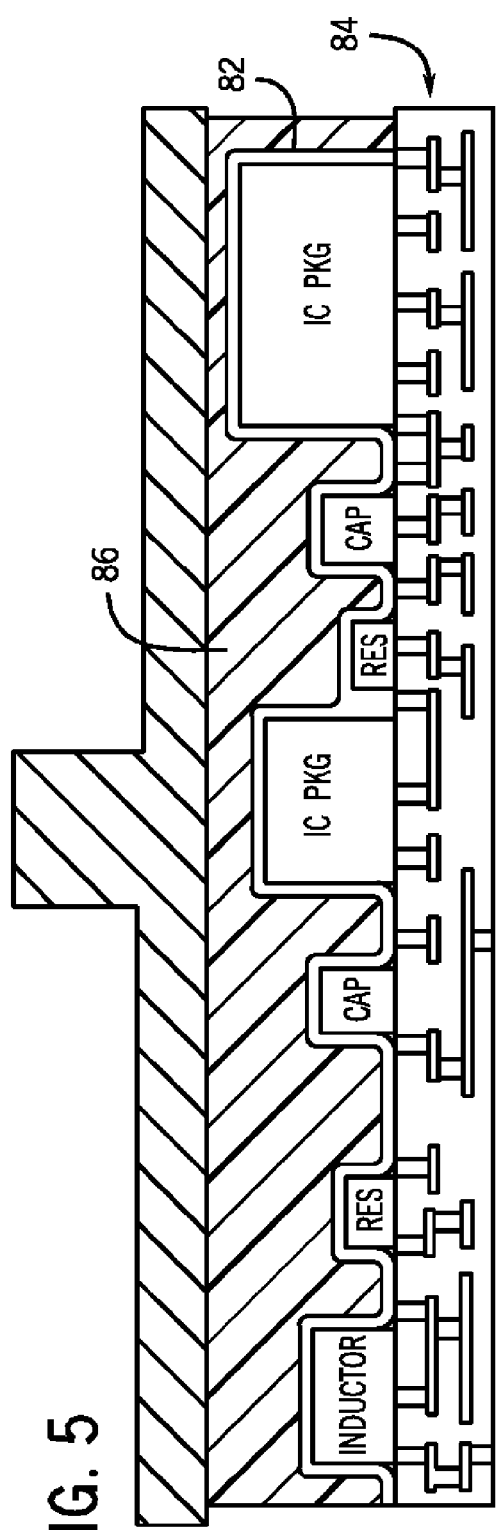

SYSTEM AND METHOD OF FORMING A LOW PROFILE CONFORMAL SHIELD

BACKGROUND OF THE INVENTION

Embodiments of the invention relate generally to electrical shields and, more particularly, to a method and apparatus for forming a conformal shield for an electrical system.

Technological advancements in the area of electronic devices have experienced vast growth in recent years. For example, while cellular phones are becoming smaller and lighter, their features and capabilities are simultaneously expanding. This has caused an increase in the complexity and operation of the electrical components found in such devices and a decrease in the amount of space available for such components. In such electrical devices, many electronic components radiate electromagnetic radiation, which may cause interference with other electrical devices. Radio frequency and electromagnetic interference (i.e., RFI and EMI) may detrimentally affect the performance and operation of other electrical devices. As a result, shields have been used to prevent such components from causing such interference.

The most common RFI/EMI shields are box-type shields comprised of a single piece of folded or stamped metal (i.e., metal cans, metal foil claddings, etc.) contoured to fit over a PC board. Space must be allocated on the circuit board to accommodate these box-type shields, which reduces the space available for other components. That is, conventional box-type shields are bulky and take up a great deal of space and volume, a majority of which is an unused air gap between the circuit board and the shield. This can add to the overall thickness of an electronic device (e.g., a cellular phone). Additionally, a product may have many components requiring RFI/EMI shielding from other components within the product as well as from external sources. Depending on the number of the shields needed, significant weight and cost may be added to the product.

Another drawback of typical box-type shields is that they are soldered onto the circuit board. Such soldering of the box-type shield to the circuit board makes it difficult to re-test or rework the circuit board, as it is extremely time consuming and difficult to unsolder and remove the RFI/EMI shield originally in place. Furthermore, the facilitation of a shielding redesign made late in the product design cycle, which may be necessary after product testing, is extremely difficult with space consuming box-type shields that are soldered onto the circuit board.

Therefore, it would be desirable to design a low profile, low weight, high performance RFI/EMI shield. It is further desired that such a shield allow for efficient re-testing and reworking of a circuit board or other electrical system.

BRIEF DESCRIPTION OF THE INVENTION

Embodiments of the invention overcome the aforementioned drawbacks by providing a conformal shield for an electrical system, and method of manufacturing thereof, that provides for shielding of the circuit board from RF and/or EM interference. A conformal shield is formed by applying a conformal insulating coating to an electrical system with attached components and forming a plurality of openings in the insulating coating at desired locations, and depositing a first and second metallic layers over the insulating coating and in each of the plurality of openings, such that the metallic layers are electrically connected with the electrical system at the desired locations.

In accordance with one aspect of the invention, a method of forming a conformal shield includes the steps of applying a conformal insulating coating to an electrical system, forming a plurality of openings in the insulating coating at desired locations, and depositing a first metallic layer over the insulating coating and in each of the plurality of openings, the first metallic layer being electrically connected with the circuit board at the desired locations. The method further includes the step of depositing a second metallic layer onto the first metallic layer.

In accordance with another aspect of the invention, a conformal shield includes a dielectric coating shaped to conform to a front surface of a circuit board, the dielectric coating having at least two openings therein positioned over contact pads on the front surface of the circuit board. The conformal shield also includes a first metallic coating layered on the dielectric coating and on the contact pads such that an electrical connection is formed between the first metallic coating and the contact pads, and a second metallic coating layered on the first metallic coating.

In accordance with yet another aspect of the invention, a method for manufacturing a conformal shield includes the steps of applying an ultraviolet-curable polymer coating to a circuit board, forming an opening in the polymer coating adjacent to each of a plurality of contact pads on the circuit board, and depositing a conductive layer over the polymer coating and in the opening adjacent to each of the plurality of contact pads, the conductive layer being electrically coupled to the circuit board at the plurality of contact pads. The method also includes the step of increasing a thickness of the conductive layer to increase at least one of a radio frequency (RF) shielding property and an electromagnetic (EM) shielding property of the conductive layer.

These and other advantages and features will be more readily understood from the following detailed description of preferred embodiments of the invention that is provided in connection with the accompanying drawings.

BRIEF DESCRIPTION OF THE DRAWINGS

FIG. 4 is a cross-sectional view of a conformal RF shield according to another embodiment of the invention.

FIG. 5 is a cross-sectional view of a conformal RF shield according to another embodiment of the invention.

DETAILED DESCRIPTION OF THE PREFERRED EMBODIMENT

The present invention provides for a conformal shield for shielding an article. The shield is described as being conformal because it is formed to conform or adapt to the shape of the article to be shielded. While described below with respect to use with a printed circuit board (PCB), it is envisioned that the conformal shield of the invention may be used to shield other electrical systems and electronic devices.

Figure 1:
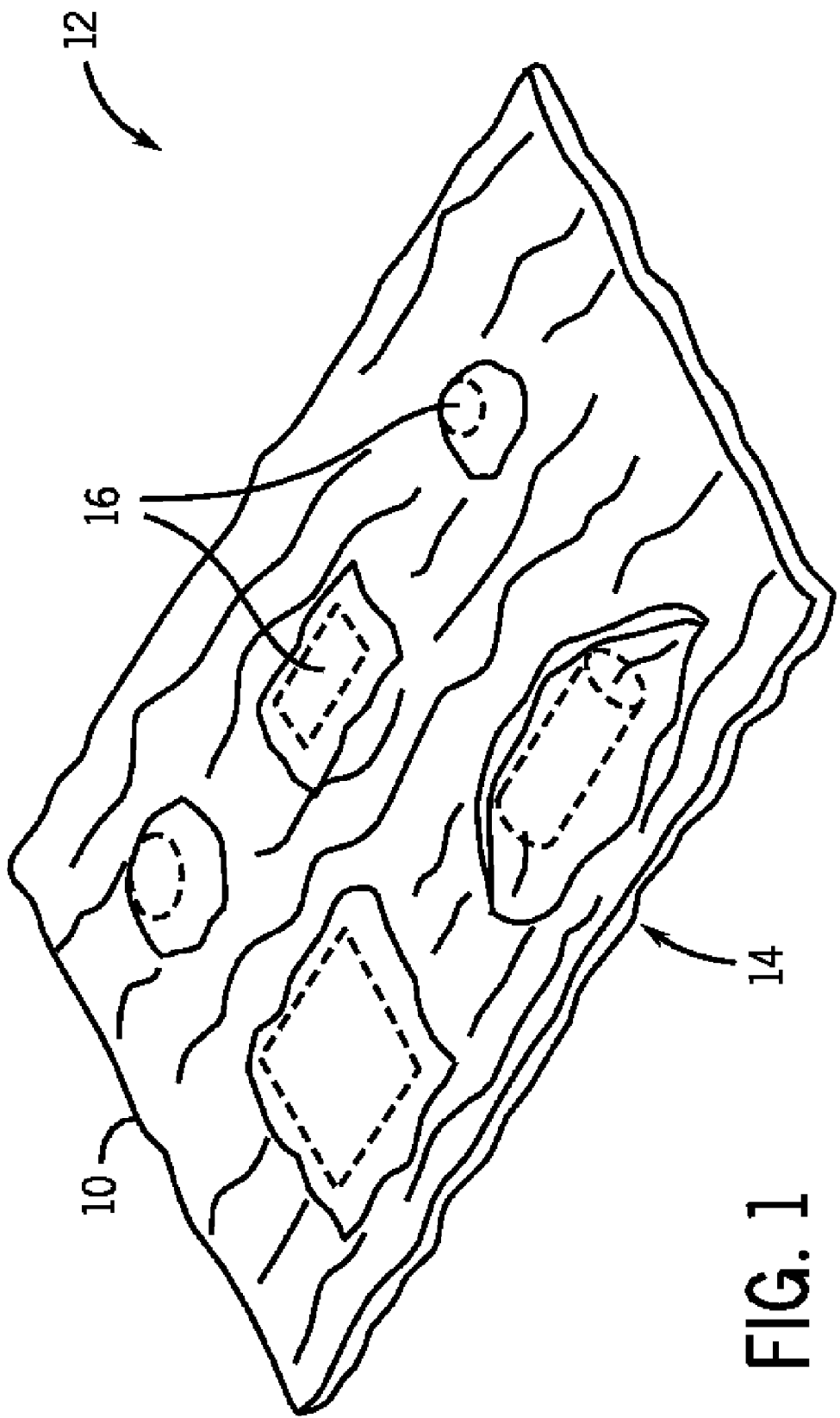
FIG. 1 is a perspective view of a conformal radio frequency (RF) shield formed on a populated printed circuit board according to an embodiment of the invention.

Referring to FIG. 1, a perspective view of a conformal shield 10 is shown in accordance with the invention. The conformal shield 10 forms part of a shielded circuit assembly 12, together with a circuit substrate 14, such as a printed circuit board (PCB), flex PCB, or rigid flex PCB and circuit components 16 disposed on the circuit substrate 14. The conformal shield 10 is disposed on the circuit substrate 14 and circuit components 16 so as to conform about the components and at least a portion of the circuit substrate. The resulting structure is a substantially enclosed shielded circuit assembly 12, which provides shielding to individual circuit components 16. The conformal shield 10 provides protection to the circuit components 16 from internally- and externally-sourced interfering elements. That is, conformal shield 10 protects circuit components 16 from radio frequency (RF) interference, electromagnetic (EM) interference, electrostatic discharge, and environmental elements such as moisture, dust, and environmental contaminants. Additionally, in an embodiment of the invention, conformal shield 10 conforms to each circuit component 16 such that each component 16 is individually protected and shielded from potential interference from the other components 16 of the circuit assembly 12. While described for use with a circuit substrate 14 and circuit components 16, it is also envisioned that conformal shield 10 could be positioned over other electrical systems sensitive to RF and EM interference.

Figure 2:
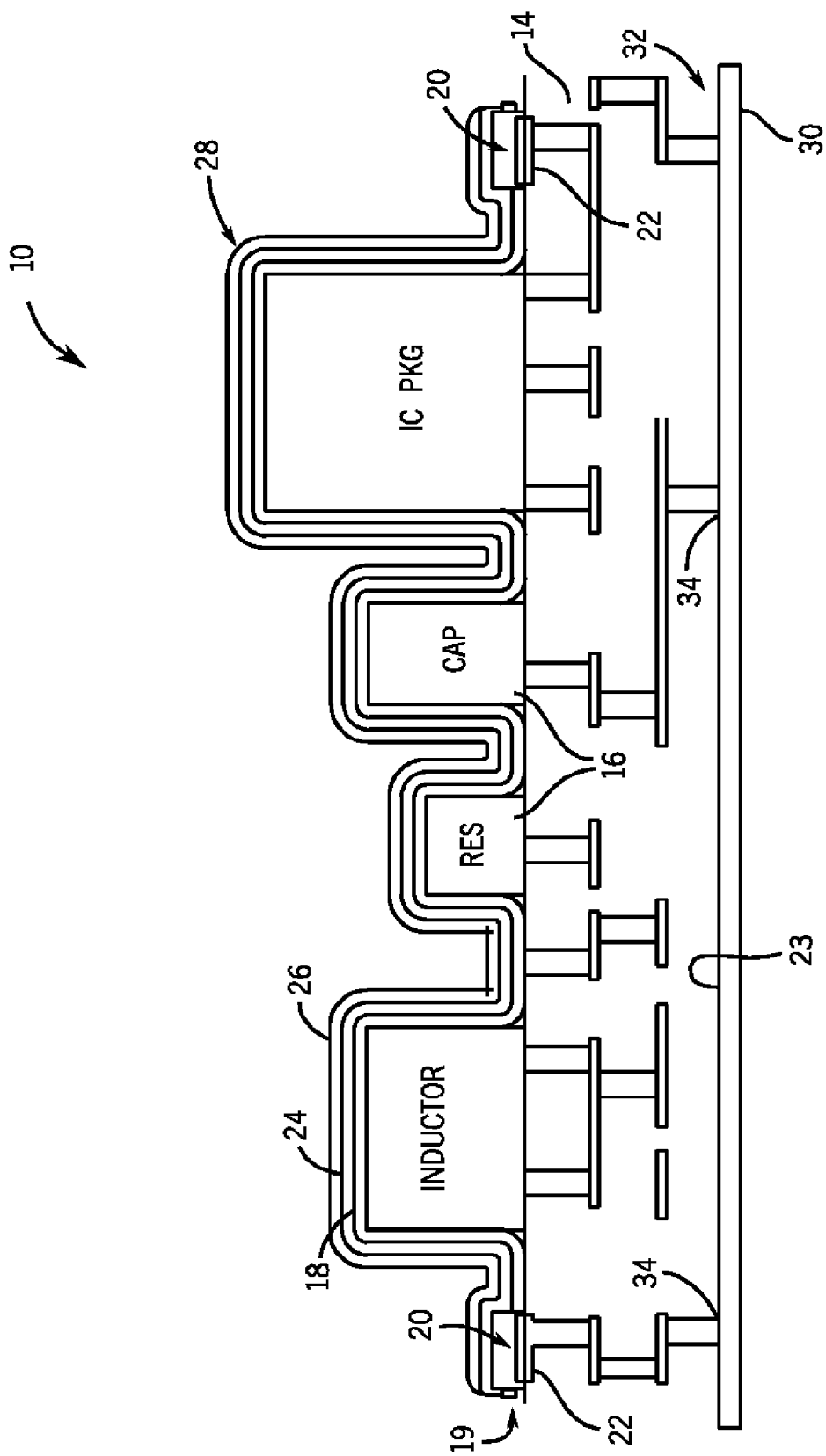
FIG. 2 is a cross-sectional view of a conformal RF shield according to an embodiment of the invention.

Referring now to FIG. 2, a cross-sectional view of conformal shield 10 is shown, in accordance with an embodiment of the invention. The conformal shield 10 is formed from a conformable material that can be adapted to the shape of the circuit substrate 14 and the circuit components 16 (e.g., resistors, integrated circuit packages, capacitors, inductors, etc.) upon which it is disposed. The conformal shield 10 includes a dielectric layer or coating 18 (i.e., electrically insulating layer) that is positioned adjacent to and formed over a top surface 19 of circuit substrate 14 and the circuit components 16 positioned thereon. The dielectric layer 18 makes contact with the circuit components 16 so as to help protect the components and other portions of the circuitry on the circuit substrate 14 from electrical shorts. The dielectric layer 18 can be formed of any electrically insulating material that can be made to conform to the shape of the circuit assembly 12, and in one embodiment, comprises a ultraviolet (UV) curable polymer such as, for example, a UV light curing conformal coating by Dymax Corp. It is also envisioned, however, that other suitable epoxy coatings or silicone-based coatings could also be used to form dielectric layer 18. In depositing dielectric layer 18 on circuit assembly 12, a spray coating process can be employed. Such an application process provides a controllable and reproducible depositing of dielectric coating 18 on circuit assembly 12, allowing for control of the thickness of the dielectric layer. It is also envisioned, however, that a dip coating process can be used to deposit dielectric layer 18 on circuit assembly 12. Importantly, the deposition of dielectric coating 18 on circuit assembly 12 via one of the above techniques results in a coating having a uniform thickness and that is pinhole-free.

A plurality of openings 20 are formed in dielectric coating 18 to expose contact pads 22 located on circuit substrate 14. Exposing of contact pads 22 allows for electrical coupling of the conformal shield 10 to a ground plane 23 of the circuit substrate 14, as will be explained in greater detail below. In an exemplary embodiment, openings 20 are formed by way of a laser ablation process. That is, a laser is directed to points on dielectric coating above contact pads 22, so as to ablate/burn any dielectric material positioned thereover. Alternatively, it is also envisioned that a masking layer (not shown) can be applied over contact pads 22 before depositing of the dielectric layer 18. The masking layer can then be removed after deposition of the dielectric layer 18, thus providing an opening through the dielectric layer to expose contact pads 22. It is recognized that the exposing of contact pads 22 also allows for a manufacturer to test the circuit assembly 12 after forming dielectric layer 18.

A first metallic layer 24 (i.e., base layer) is deposited on top of the dielectric layer 18 after the dielectric layer has been allowed to cure and after formation of openings 20. The first metallic layer 24 is comprised of an electrically conductive metal, such as for example copper, silver, or nickel, so as to provide RF and EM shielding to the circuit assembly 12. It is envisioned that other suitable materials could also be used to form first metallic layer 24, and that additionally, first metallic layer 24 could be formed of multiple layers (not shown) to provide better adhesion between the first metallic layer 24 and dielectric layer 18 (e.g., a titanium layer adjacent to the dielectric layer and a copper layer on the titanium layer). The first metallic layer 24 is applied to the dielectric layer via one of several known metal deposition techniques. In one embodiment, first metallic layer 24 is applied by an electroless plating process, although it is envisioned that a sputtering or evaporative coating process could also be employed. Thus, it is recognized that the first metallic layer can be formed as a metallic particulate coating. In addition to being deposited over dielectric layer 18, first metallic layer 24 is also deposited in openings 20 so as to form an electrical connection with contact pads 22. This electrical connection between first metallic layer 24 and contact pads 22 provides for coupling of the conformal shield 10 to the circuit substrate 14 and provides enhanced shielding to reduce RF emissions entering or leaving protected areas.

The first metallic layer 24 is deposited on dielectric layer 18 such that it has at least a minimal thickness so as to provide uniform and complete metal coverage (e.g., 1-2 kÅ). To provide for improved RF and EM shielding of circuit assembly 12, a second metallic layer 26 is applied to first metallic layer 24 to increase overall thickness of the metallic shielding in conformal shield 10. Similar to first metallic layer 24, second metallic layer 26 is comprised of an electrically conductive metal, such as copper, silver, or nickel, or another suitable material. In one embodiment, second metallic layer 26 is deposited on first metallic layer 24 via an electroplating process, although it is also envisioned that an additional electroless plating, sputtering, or evaporative coating process could also be employed. While described above as separate first and second metallic layers 24, 26, it is recognized that application of second metallic layer 26 to first metallic layer 24 via an electroplating process results in a composite metallic layer 28 having no distinguishable boundary therebetween. Composite metallic layer 28 provides an increased thickness and improved RF and EM shielding capabilities as compared to the first metallic layer 24 alone. Preferably, the total thickness of composite metallic layer 28 is in the range of 2 to 5 micrometers.

It is also envisioned that, during formation of conformal shield 10, a protective layer 30 (e.g., a photoresist layer) can be applied to a back surface 32 of circuit substrate 14. That is, prior to application of first metallic layer 24, such as through an electroless plating process, protective layer 30 can be applied to back surface 32 of circuit substrate 14. Application of protective layer 30 eliminates metallization of contacts 34 or backside components that might occur during a subsequent application of first metallic layer 24. After application of first and second metallic layers 24, 26, protective layer 30 may be removed to re-expose contacts 34 on the back surface 32, thus completing a process of applying conformal shield 10 to circuit assembly 12.

Upon completion of conformal shield 10, the circuit assembly 12 can be inserted into the end product (e.g., cellular phone) and tested to determine if the assembly is functioning properly. Beneficially, if circuit assembly 12 fails this functionality test, the assembly can be removed from the product and the conformal shield 10 removed so as to allow for reworking of the circuit assembly. That is, as distinguished from prior art box-type shields, conformal shield 10 allows for testing of circuit assembly 12 after formation of the shield on the circuit assembly. More specifically, composite metallic layer 28 can be removed via an etching process and the dielectric layer 18 removed, such that the circuit assembly 12 can then be repaired/reworked. To protect backside contacts 34 during such an etching/removal process, protective layer 30 can be reapplied before initiation of the etching and removal of the metallic layer 28 and dielectric layer 18.

Figure 3:
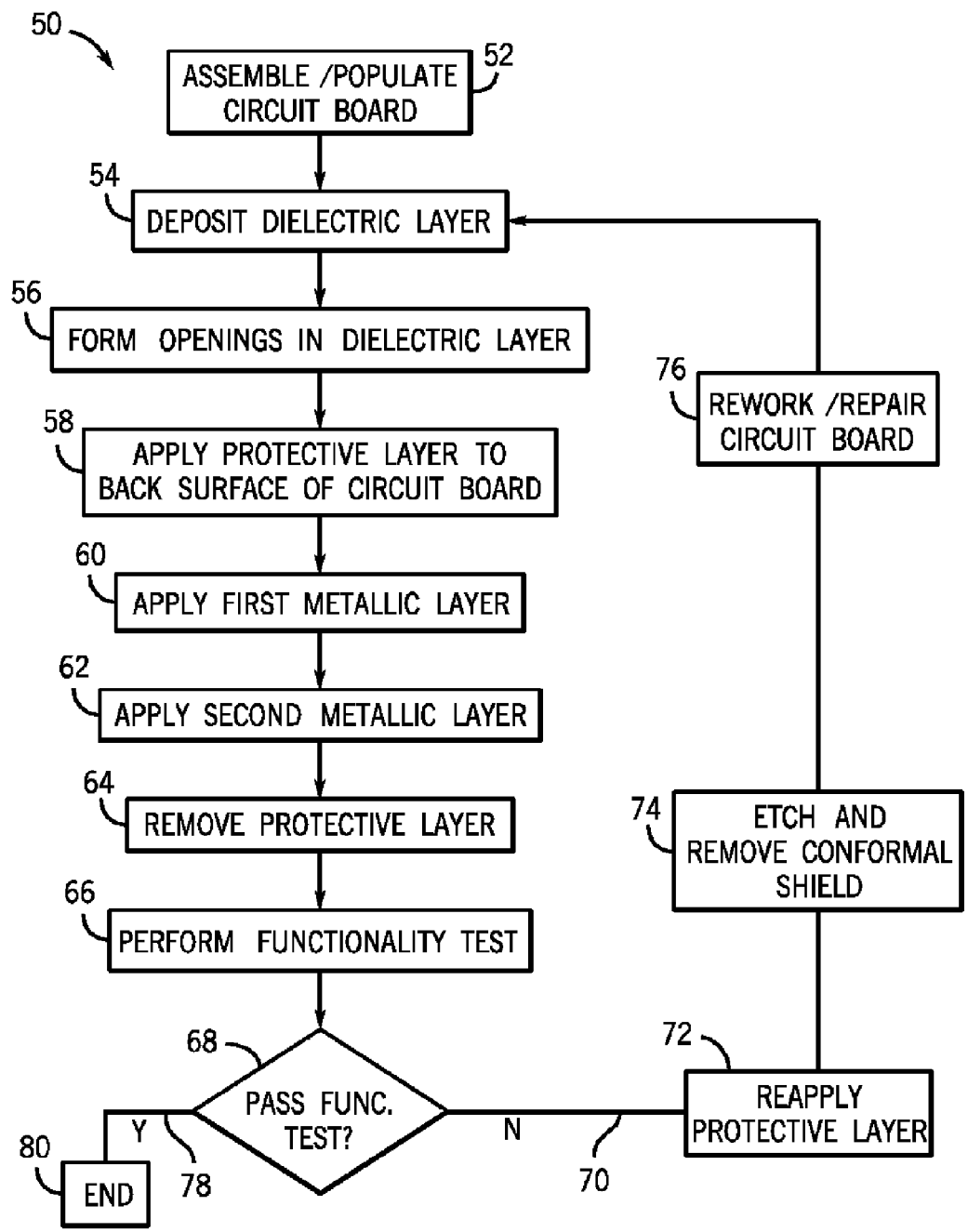
FIG. 3 is a flow chart of a process for manufacturing a conformal RF shield according to an embodiment of the invention.

Referring to FIG. 3, an exemplary process for manufacturing a shielded circuit assembly is set forth, according to an embodiment of the invention. The process 50 begins with assembly of a circuit board and the population of circuit components thereon, as shown at STEP 52. A dielectric layer is deposited on a front surface of the circuit assembly at STEP 54, such as via a spray coating or dip coating process. Preferably, the dielectric layer comprises a UV curable polymer, to allow for quick curing thereof (e.g., within 3-5 seconds).

Subsequent to deposition of the dielectric layer, a plurality of openings are formed in the dielectric coating at STEP 56 to expose contact pads located on the front surface of the circuit board. Exposing of contact pads allows for electrical coupling of the conformal shield to, for example, a ground plane of the circuit board. In an exemplary process, the openings in the dielectric layer are formed by way of a laser ablation process. Alternatively, it is also envisioned that a masking layer can be applied over the contact pads before depositing of the dielectric layer. The masking layer can be removed after deposition of the dielectric layer, thus providing an opening through the dielectric layer to expose the contact pads.

Upon formation of the openings, a protective layer is applied to a back surface of the circuit board at STEP 58. The protective layer can be composed of, for example, a spray-on material or a photoresist material that can be easily applied and removed and hold up to plating chemistry. Subsequent to application of the protective layer, a first metallic layer is applied to the dielectric coating and exposed contact pads within the openings formed in the dielectric coating, at STEP 60. The first metallic layer includes an electrically conductive metal, such as copper, gold, nickel, or another suitable material that provides RF shielding to the circuit assembly, and is applied via an electroless plating, sputtering, or evaporative coating process. The first metallic layer can thus comprise a metallic particulate coating. Depositing of the first metallic layer in openings of the dielectric layer allows for formation of an electrical connection between the metallic layer and the contact pads. In an embodiment of the invention, this electrical connection provides for grounding of the conformal shield to the circuit board.

Upon application of the first metallic layer, subsequent steps can be performed to thicken the first metallic layer and provide the conformal shield with improved RF and EM shielding characteristics. Thus a second metallic layer is applied to first metallic layer at STEP 62. In an exemplary embodiment, the second metallic layer is deposited on the first metallic layer via an electroplating process so as to provide a composite metallic layer having desirable RF/EM shielding properties. By way of the electroplating process, the composite metallic layer can be formed to have a total thickness of, for example, 2 to 5 micrometers.

Upon application of the second metallic layer, the protective layer is removed at STEP 64 to re-expose the back surface of the circuit board. Upon removal of the protective layer, testing of the circuit assembly is performed at STEP 66, such as via insertion of the board into an end use product, and a determination is made if the circuit board passes the functionality test at STEP 68. If the circuit assembly fails a functionality test, as shown at STEP 70, a protective layer can be reapplied to the back surface of the circuit board at STEP 72 to protect backside contacts. The conformal shield is then etched and removed at STEP 74, so as to allow for reworking of the circuit assembly. More specifically, the composite metallic layer can be removed via an etching process, and the dielectric layer can be removed to allow for access to the circuit assembly and its associated circuit components for repair/reworking at STEP 76. After repairing/reworking of the circuit board, STEPS 54-64 can be performed again to reapply the conformal shield to the circuit board. If, however, the circuit board is deemed functional after performing of the functionality test, as shown at STEP 78, then no reworking/repair of the circuit is required and the manufacturing/testing process can be ended at STEP 80.

Referring now to FIG. 4, in another embodiment, a dielectric layer 82 included in the conformal shield is comprised of a thermoplastic film. The thermoplastic film 82 is originally in a sheet form, and heat and pressure are applied thereto to conform the film to a circuit assembly 84. As shown in FIG. 4, a highly deformable material 86, such as a silicone material) is positioned above thermoplastic film 82. The thermoplastic film 82 is then reshaped to conform to circuit assembly 84 by applying pressure to deformable material 86 and adding heat. The deformable material 86 and the thermoplastic film 82 are thus caused to deform and take the shape of the circuit assembly 84, as shown in FIG. 5. The deformable material 86 is then removed from the conformed thermoplastic film 82, and first and second metallic layers 24, 26 are applied to the thermoplastic film 82 and exposed contact pads 22 within the openings 20, as set forth in detail above and as shown in FIG. 2.

While the conformal shield (and technique of forming the conformal shield) set forth above are described with respect to the shielding of a front surface of a printed circuit board populated with circuit components, other embodiments are also envisioned. That is, it is recognized that the conformal shield could be formed on a back surface of the circuit board instead of, or in addition to, being formed on the front surface. Additionally, it is recognized that the conformal shield could be formed on a circuit board without circuit components thereon.

As set forth in the above description, the conformal shield of the invention offers significant benefits over existing box-type shields. These benefits include simple design and construction, low cost, and compact design. The conformal shield 10 provides RF and EM protection without adding significant size or weight to a product, thus allowing for product miniaturization and manufacturing cost reduction and the elimination of a solder step, temperature cycle and, solder materials. Moreover, design cycle time and design costs can be saved by eliminating the need to accommodate conventional metal box-type shields. The elimination of metal can shields also reduces the part count and overall product weight. The conformal shield 10 also allows for testing of a circuit assembly subsequent to application of the shield thereon and, if the circuit assembly tests faulty, for the simple removal of the conformal shield so as to allow reworking of the assembly.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to one embodiment of the invention, a method of forming a conformal shield includes the steps of applying a conformal insulating coating to an electrical system, forming a plurality of openings in the insulating coating at desired locations, and depositing a first metallic layer over the insulating coating and in each of the plurality of openings, the first metallic layer being electrically connected with the circuit board at the desired locations. The method further includes the step of depositing a second metallic layer onto the first metallic layer.

According to another embodiment of the invention, a conformal shield includes a dielectric coating shaped to conform to a front surface of a circuit board, the dielectric coating having at least two openings therein positioned over contact pads on the front surface of the circuit board. The conformal shield also includes a first metallic coating layered on the dielectric coating and on the contact pads such that an electrical connection is formed between the first metallic coating and the contact pads, and a second metallic coating layered on the first metallic coating.

According to yet another embodiment of the invention, a method for manufacturing a conformal shield includes the steps of applying an ultraviolet-curable polymer coating to a circuit board, forming an opening in the polymer coating adjacent to each of a plurality of contact pads on the circuit board, and depositing a conductive layer over the polymer coating and in the opening adjacent to each of the plurality of contact pads, the conductive layer being electrically coupled to the circuit board at the plurality of contact pads. The method also includes the step of increasing a thickness of the conductive layer to increase at least one of a radio frequency (RF) shielding property and an electromagnetic (EM) shielding property of the conductive layer.

What is claimed as new and desired to be protected by Letters Patent of the United States is:

1. A method of forming a conformal shield, comprising:
    applying a conformal insulating coating to an electrical system;
    forming a plurality of openings in the insulating coating at desired locations;
    depositing a first metallic layer over the insulating coating and in each of the plurality of openings, the first metallic layer being electrically connected with the electrical system at the desired locations;
    depositing a second metallic layer onto the first metallic layer; and
    wherein the method further comprises:
        applying a protective coating onto a back surface of the electrical system prior to depositing the first metallic layer; and
        removing the protective coating from the back surface of the electrical system subsequent to depositing of the second metallic layer.

2. The method of claim 1 wherein applying the conformal insulating coating comprises spray coating the insulating coating on the electrical system.

3. The method of claim 1 wherein applying the conformal insulating coating comprises dip coating the electrical system in the insulating coating.

4. The method of claim 1 wherein applying the conformal insulating coating comprises:
    placing a thermoplastic film over the electrical system;
    positioning a silicone layer over the thermoplastic film;
    applying heat and pressure to the thermoplastic film and the silicone layer to shape the thermoplastic film so as to conform to the electrical system.

5. The method of claim 1 wherein the conformal insulating coating comprises one of an ultraviolet-curable polymer, an epoxy coating, and a silicone-based coating.

6. The method of claim 1 wherein forming the plurality of openings in the insulating coating comprises laser-ablating the insulating coating at locations corresponding to contact pads on the electrical system.

7. The method of claim 1 wherein forming the plurality of openings in the insulating coating comprises:
    applying a masking layer over contact pads on the electrical system prior to application of the insulating coating; and
    removing the masking layer from the contact pads after application of the insulating coating so as to form openings in the insulating coating.

8. The method of claim 1 wherein depositing the first metallic layer comprises one of electroless plating, sputtering, and evaporating.

9. The method of claim 1 wherein depositing the second metallic layer comprises electroplating the second metallic layer onto the first metallic layer.

10. The method of claim 1 further comprising:
    performing a functionality test on the electrical system after depositing the second metallic layer onto the first metallic layer; and
    if the electrical system fails the functionality test, then:
        reapplying the protective coating;
        etching off the first and second metallic layers; and
        removing the insulating coating to allow for reworking of the electrical system.

11. The method of claim 1 wherein the first and second metallic layers have a combined thickness of between approximately 2 and 5 micrometers.

12. The method of claim 1 wherein the electrical system comprises a circuit board and circuit board components positioned thereon.

13. A method for manufacturing a conformal shield, comprising:
    applying an ultraviolet-curable polymer coating to a circuit board;
    forming an opening in the polymer coating adjacent to each of a plurality of contact pads on the circuit board;
    depositing a conductive layer over the polymer coating and in the opening adjacent to each of the plurality of contact pads, the conductive layer being electrically coupled to the circuit board at the plurality of contact pads; and
    increasing a thickness of the conductive layer to increase at least one of a radio frequency (RF) shielding property and an electromagnetic (EM) shielding property of the conductive layer; and
    wherein the method further comprises:
        applying a protective coating onto a back surface of the circuit board prior to depositing the conductive layer; and
        removing the protective coating from the back surface of the circuit board subsequent to electroplating the second metallic layer.

14. The method of claim 13 wherein forming an opening in the polymer insulating coating adjacent to each of a plurality of contact pads comprises laser-ablating the insulating coating at locations corresponding to contact pads on the circuit board.

15. The method of claim 13 wherein depositing a conductive layer comprises one of electroless plating, sputtering, and evaporating a metallic layer on the polymer coating.

16. The method of claim 13 wherein increasing the thickness of the conductive layer comprises electroplating a second metallic layer onto the conductive layer.

17. A method of forming a conformal shield, comprising:
   applying a conformal insulating coating to an electrical system, wherein applying the conformal insulating coating comprises:
      placing a thermoplastic film over the electrical system;
      positioning a silicone layer over the thermoplastic film; and
      applying heat and pressure to the thermoplastic film and the silicone layer to shape the thermoplastic film so as to conform to the electrical system;
   forming a plurality of openings in the thermoplastic film at desired locations;
   depositing a first metallic layer over the thermoplastic film and in each of the plurality of openings, the first metallic layer being electrically connected with the electrical system at the desired locations; and
   depositing a second metallic layer onto the first metallic layer.

18. The method of claim 17 wherein applying the conformal insulating coating further comprises removing the silicone layer before the step of forming the plurality of openings in the thermoplastic film at desired locations.

* * * * *